(12) United States Patent
Schmidhammer et al.

(10) Patent No.: US 7,737,805 B2
(45) Date of Patent: Jun. 15, 2010

(54) ELECTRICAL CIRCUIT AND COMPONENT WITH SAID CIRCUIT

(75) Inventors: Edgar Schmidhammer, Stein (DE); Pasi Tikka, Unterhaching (DE)

(73) Assignee: Epcos AG, Munich (DE)

( * ) Notice: Subject to any disclaimer, the term of this patent is extended or adjusted under 35 U.S.C. 154(b) by 364 days.

(21) Appl. No.: 11/659,143

(22) PCT Filed: Jun. 8, 2005

(86) PCT No.: PCT/EP2005/006164

§ 371 (c)(1),
(2), (4) Date: Jul. 5, 2007

(87) PCT Pub. No.: WO2006/015641

PCT Pub. Date: Feb. 16, 2006

(65) Prior Publication Data

US 2009/0009262 A1    Jan. 8, 2009

(30) Foreign Application Priority Data

Aug. 4, 2004   (DE) .................. 10 2004 037 820

(51) Int. Cl.
  *H03H 9/70* (2006.01)
  *H03H 9/72* (2006.01)
(52) U.S. Cl. .................. 333/187; 333/193; 333/189
(58) Field of Classification Search .............. 333/186, 333/187, 193, 189
See application file for complete search history.

(56) References Cited

U.S. PATENT DOCUMENTS

| 5,107,234 | A | | 4/1992 | Ehrmann-Falkenau et al. |
|---|---|---|---|---|
| 5,856,728 | A | * | 1/1999 | Zimnicki et al. ....... 315/209 PZ |
| 6,064,872 | A | * | 5/2000 | Vice ............................ 455/326 |
| 6,472,953 | B1 | * | 10/2002 | Sakuragawa et al. ........ 333/133 |
| 6,563,252 | B2 | * | 5/2003 | Schrod .................. 310/316.03 |
| 6,919,781 | B2 | | 7/2005 | Baier et al. |
| 6,940,368 | B2 | | 9/2005 | Plessky et al. |
| 2001/0013815 | A1 | | 8/2001 | Sawada |
| 2002/0140520 | A1 | | 10/2002 | Hikita et al. |
| 2006/0164183 | A1 | | 7/2006 | Tikka et al. |

FOREIGN PATENT DOCUMENTS

| EP | 0 183 542 | | 11/1985 |
|---|---|---|---|
| JP | 56034243 | | 4/1981 |
| JP | 01309481 A | * | 12/1989 |
| JP | 2002-217683 | | 8/2002 |
| WO | WO01/61859 | | 8/2001 |
| WO | WO02/071610 | | 9/2002 |
| WO | WO04/034579 | | 4/2004 |

OTHER PUBLICATIONS

International Search Report for PCT/EP2005/006164.
Written Opinion for PCT/EP2005/006164.
English translation of the Written Opinion for PCT/EP2005/006164.

* cited by examiner

*Primary Examiner*—Robert Pascal
*Assistant Examiner*—Alan Wong
(74) *Attorney, Agent, or Firm*—Fish & Richardson P.C.

(57) ABSTRACT

An electrical circuit that includes an electric four-terminal network is disclosed. The electric four-terminal network includes a first electrical port with a first terminal and a second terminal and a second electrical port with a first terminal and a second terminal. The electrical circuit also includes a first shunt branch between the second terminal of first electrical port and ground.

12 Claims, 6 Drawing Sheets

ELECTRICAL CIRCUIT AND COMPONENT WITH SAID CIRCUIT

An electrical circuit that has an electric quadrupole, e.g., a filter circuit with two electrical ports is disclosed.

BACKGROUND

A four-terminal network can be wired 1) asymmetrically/asymmetrically or 2) symmetrically/symmetrically. It is also possible to wire a four-terminal network as a balun, i.e., 3) asymmetrically/symmetrically.

A duplexer is known from the publication US 2001/0013815 A1 in which a balun is realized in the receive path in a filter by a DMS track (DMS=double acoustic mode SAW, SAW=surface acoustic wave) which is connected to series resonators. The series resonators are formed as SAW resonators. The filter structures used in the duplexer are all constructed in one technology (SAW).

A duplexer with a receive path is known from the publication US 2002/0140520 A1. A receive filter is arranged therein in which a ladder-type arrangement is connected on the output side to a balun or an additional element for symmetrization of the ladder-type arrangement. The balun can be realized by LC components or by an arrangement of SAW or BAW resonators (BAW=bulk acoustic wave). Individual SAW resonators, each arranged in a track of its own, or BAW resonators arranged side by side are not acoustically coupled to one another.

An electrical circuit that can be switched between at least two of the operating modes 1), 2) or 3) is disclosed.

In some embodiments, an electrical circuit includes an electric quadrupole that has two electrical ports, each having two terminals. At least one shunt arm that runs from a terminal of the first port to ground is provided in the circuit. A switching element (first switching element), by means of which the corresponding terminal can be placed at ground potential, is provided in the shunt arm.

In a preferred variant the circuit has a second shunt branch, which runs from one terminal of the second port to ground. A switching element (second switching element) is also arranged in the second shunt branch.

In case a switching element is short-circuited, the electrical port connected thereto is asymmetric. In the case of an open switching element, the port can be operated symmetrically.

The circuit has the advantage that the respective electrical port can be switched between symmetric and asymmetric operation. The switching can be open or short circuited for a long period by applying or omitting a control voltage. In case of a short circuited first and an open second switching element, a balun can be realized by the electrical circuit, making it being possible to forgo a special balun circuit.

The electric four-terminal network is, for instance, a filter, preferably a bandpass filter. The four-terminal network preferably has component structures operating with bulk or surface acoustic waves (e.g., SAW transducers or BAW resonators; SAW=surface acoustic wave; BAW=bulk acoustic wave). Several acoustically coupled and preferably galvanically separated BAW resonators can form a resonator unit. A resonator unit operating with SAW can have several SAW transducers.

In some embodiments the quadrupole has transducers operating with surface acoustic waves. Several, for example, two transducers associated with a resonator unit are acoustically coupled to one another and preferably electrically isolated from one another. The transducers are preferably arranged side by side in an acoustic track.

The BAW resonators arranged in a resonator unit can be situated in a resonator stack one above the other and acoustically coupled to one another via a partially acoustically transmissive coupling layer arranged between them. The BAW resonators can also be arranged side by side and acoustically coupled to one another via a lateral acoustic coupling. The resonator unit preferably comprises two resonators or transducers.

Each resonator or transducer of the resonator unit in one variant is arranged in a signal path of its own. In another variant, each resonator or transducer is connected to only one of the ports and arranged between two terminals of the first or second port.

The first and/or second switching element is, for example, a PIN diode, a field-effect transistor or a microelectromechanical switch (MEMS).

The invented circuit is preferably realized in a compact component. The component preferably has a multilayer substrate with several dielectric and/or semiconductive layers. Structured metallization layers that are electrically connected to the external terminals of the component by means of through-hole contacts, for instance, are arranged between the dielectric layers. A part of the circuit can be buried in the substrate or formed in the metal layers. The substrate has, among other things, external terminals that serve to control the first or second switching element.

The electric four-terminal network and the first or second switching element are preferably realized in a common substrate or arranged on a common substrate.

Electroacoustic structures of the electrical circuit are preferably arranged on the surface of the substrate. It is also possible to mount a chip with BAW or SAW structures on the substrate. This chip can be connected to the substrate by wire-bonding or by flip-chip technology.

In one variant the switching elements are realized in the interior of the substrate. In another variant the switching elements are mounted on top of the substrate.

The substrate preferably has ceramic layers as dielectric layers. The dielectric layers can also consist of a synthetic resin or an organic material. The substrate can have different types of dielectric or semiconductive layers arranged one above another (e.g., Si and $SiO_2$).

The invention will be explained in detail below on the basis of embodiments and the associated figures. The figures show various embodiments of the invention on the basis of schematic representation not drawn to scale. Identical or identically acting parts are labeled with identical reference characters. Shown are:

DETAILED DESCRIPTION

Figure 1:
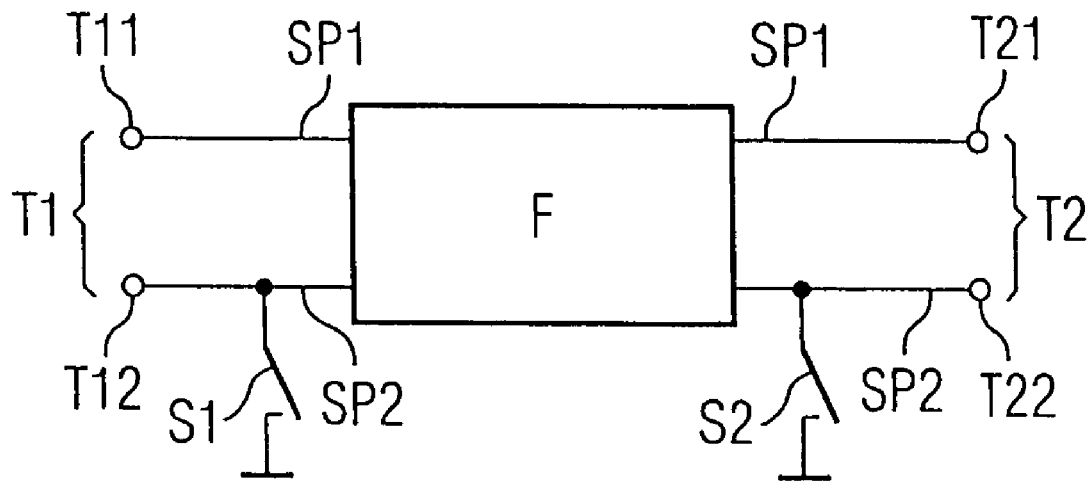
FIG. 1, an equivalent circuit diagram of the electrical circuit.

FIG. 1 shows an equivalent circuit diagram of the circuit. The circuit has an electric quadrupole F with a first electrical port T1 and a second electrical port T2. A first signal path SP1 is arranged between a first terminal T11 of the first port and a first terminal T21 of the second port. A second signal path SP2 is arranged between a second terminal T12 of the first port and a second terminal T22 of the second port. A shunt arm which contains a first switching element S1 is arranged between second signal path SP2 and ground on the side of first port T1. A shunt arm which contains a second switching element S2 is arranged between second signal path SP2 and ground on the side of second port T2.

Figure 2:
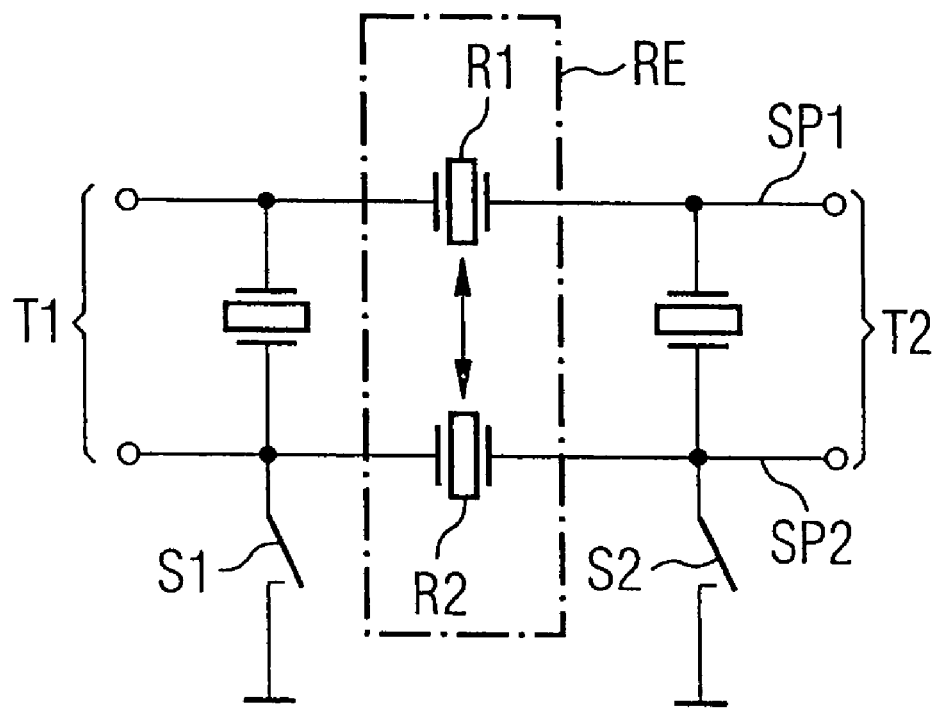
FIG. 2, the circuit with a resonator unit, the acoustically coupled resonators of which are each arranged in a signal path of their own.
Figure 3A:
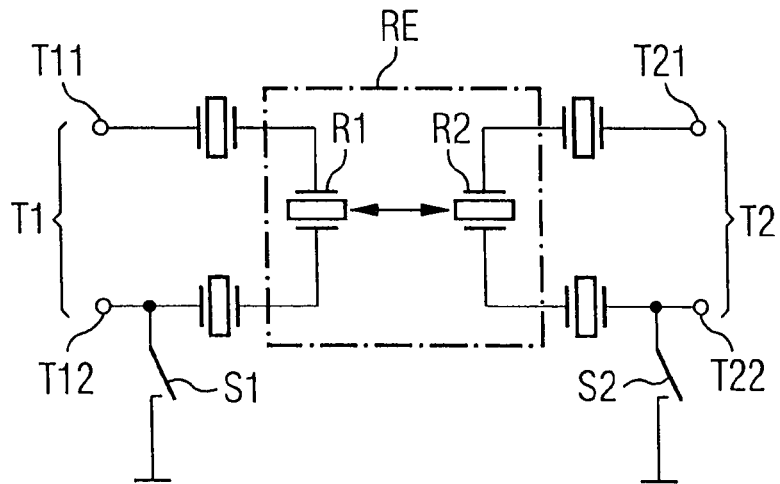
FIG. 3A, the circuit with filter in ladder-type arrangement and a resonator unit, the acoustically coupled resonators of which are each coupled to an electrical port of their own.

Four-terminal network F is preferably a filter operating with acoustic waves. A filter with BAW resonators in ladder-type construction is shown in FIGS. 2 and 3A. The filter in FIG. 2 has a first resonator R1 arranged in first signal path SP1 and a second resonator R2 arranged in second signal path SP2, these being acoustically coupled and together forming a resonator unit RE. Resonators R1, R2 here are series resonators. Shunt branches, each with a parallel resonator, are arranged between signal paths SP1, SP2.

The filter in FIG. 3A has a first resonator R1 arranged between terminals T11, T12 of first port T1, and a second resonator R2 arranged between terminals T21, T22 of second port T2. Resonators R1, R2 are acoustically coupled and form a resonator unit RE. Resonators R1, R2 here are parallel resonators that are arranged in the shunt branchs between signal paths SP1, SP2. The resonator unit is interconnected to the series resonators arranged in signal paths SP1, SP2.

Resonators R1, R2 in FIGS. 2 and 3A are not electrically connected to one another.

Figure 3B:
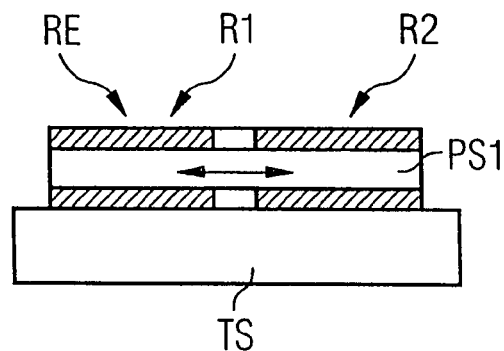
FIG. 3B, a resonator unit with resonators arranged side by side and acoustically coupled in the lateral direction.

FIG. 3B shows a resonator unit RE with two resonators R1, R2 that are arranged side by side and are acoustically coupled laterally. The lateral coupling of the resonators is made possible by the excitation of lateral acoustic modes. The two resonators R1, R2 have a common piezoelectric layer PS1.

Figure 3C:
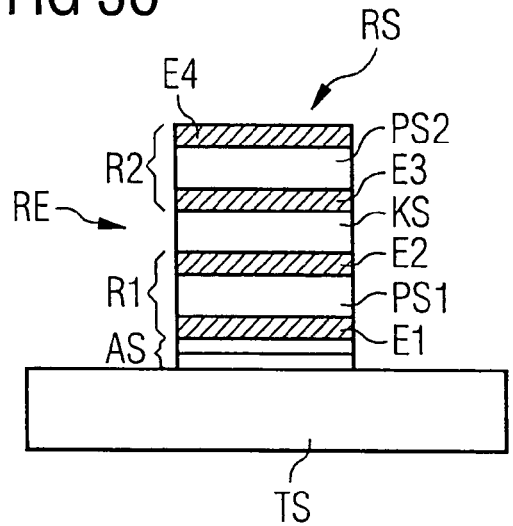
FIG. 3C, a resonator unit that is realized as a resonator stack.

In one variant, a filter or a part of the filter can be realized by a resonator stack, for instance, resonator stack RS according to FIG. 3C. Resonator stack RS is constructed on a substrate TS. Resonator stack RS has a first resonator R1, a second resonator R2 and a partially acoustically transmissive coupling layer KS arranged therebetween. An acoustic mirror AS is arranged between substrate TS and the resonator stack. Acoustic mirror AS has several layers with high and low acoustic impedance arranged alternately one above the other. The layer thickness of these layers is preferably one quarter wavelength of the resonant frequency of first resonator R1.

First resonator R1 is formed by two electrode layers E1, E2 and a piezoelectric layer PS1 arranged between them. Second resonator R2 is formed by two electrode layers E3, E4 and a piezoelectric layer PS2 arranged between them.

The resonator stack can be arranged, in a manner not illustrated here, above a cavity formed in substrate TS.

Figure 4A:
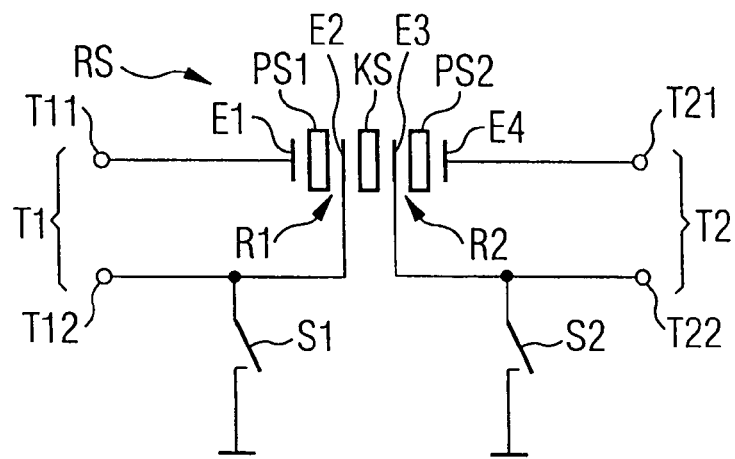
FIG. 4A, the equivalent circuit diagram of the circuit with the resonator unit of FIG. 3C.

FIG. 4A shows a circuit according to FIG. 1 with a four-terminal network that is constructed as resonator stack RS according to FIG. 3C.

Lower electrode E1 of first resonator R1 is connected to first terminal T11 of first electrical port T1. Electrode E2 of first resonator R1 facing coupling layer KS is connected to second terminal T12 of first electrical port T1. Electrode E3 of second resonator R2 facing coupling layer KS is connected to second terminal T22 of second electrical port T2. Upper electrode E4 of second resonator R2 is connected to first terminal T21 of second electrical port T2. First resonator R1 is thus connected to first port T1, and second resonator R2 to second port [T2]. Resonators R1, R2 are electrically isolated by coupling layer KS and acoustically coupled by this layer.

Figure 6:
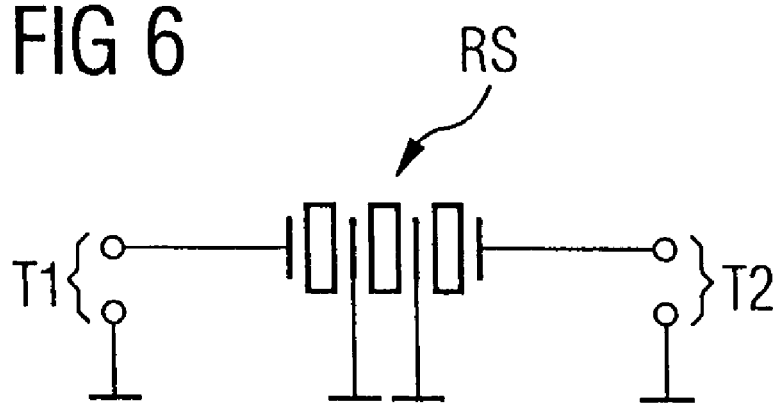
FIG. 6, the circuit of FIG. 4A to be operated asymmetrically/asymmetrically, with short-circuited switching elements.
Figure 7:
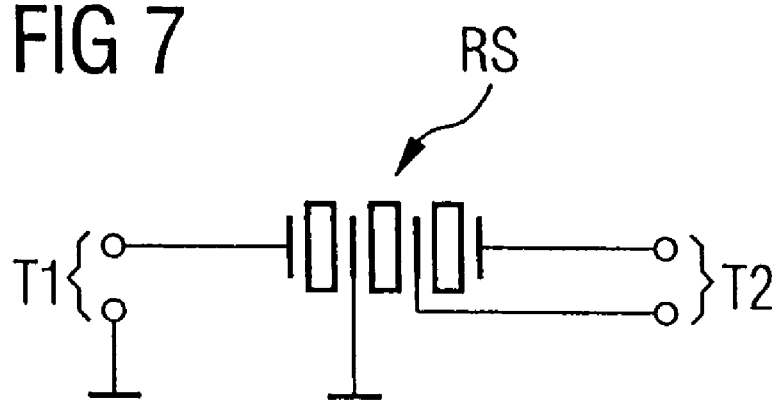
FIG. 7, the circuit of FIG. 4A to be operated asymmetrically/symmetrically, with one short-circuited and one open switching element.
Figure 8:
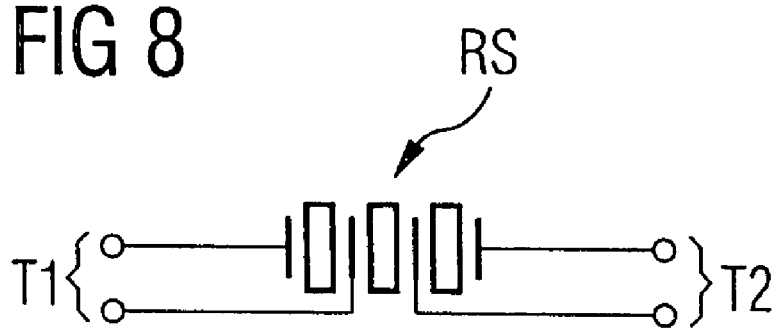
FIG. 8, the circuit of FIG. 4A to be operated symmetrically/symmetrically, with open switching elements.

With short-circuited switching elements S1, S2, the circuitry according to FIG. 6 results, with the filter being operated asymmetrically/asymmetrically. With short-circuited first switching element S1 and open second switching element S2, the circuitry according to FIG. 7 results, with the filter being operated as a balun. With both switching elements S1, S2 open, the circuitry according to FIG. 8 results, with the filter being operated symmetrically/symmetrically.

Figure 4B:
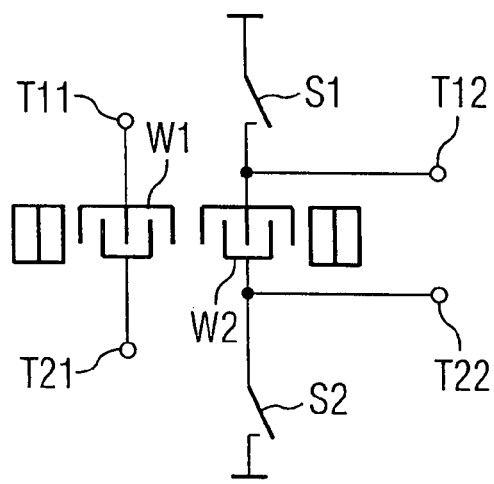
FIG. 4B, a circuit operating with SAW with two acoustically coupled transducers, each in a signal path of its own, in a common acoustic track.

FIG. 4B shows a filter operating with surface acoustic waves with an acoustic track that is delimited by two acoustic reflectors. A first transducer W1 and a second transducer W2 are arranged in the acoustic track.

Transducers W1, W2 are acoustically coupled to one another and not electrically connected to one another. First transducer W1 is arranged between first terminal T11 of first port T1 and first terminal T21 of second port T2. Second transducer W2 is arranged between second terminal T12 of first port T1 and second terminal T22 of second port T2.

Figure 4C:
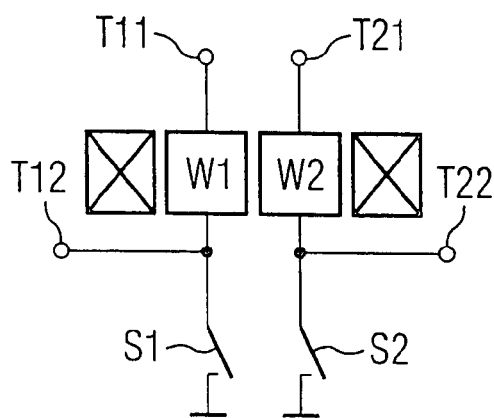
FIG. 4C, a circuit operating with SAW with two acoustically coupled transducers, each connected to its own signal path, in a common acoustic track.

FIG. 4C shows an additional filter operating with surface acoustic waves, with an acoustic track in which transducers W1, W2 are arranged. In this variant, first transducer W1 is arranged between first and second terminals T11, T12 of first port T1. Second transducer W2 is arranged between first and second terminals T21, T22 of second port T2.

An acoustic track corresponds to a resonator unit. In embodiments according to FIGS. 4B and 4C, transducers W1, W2 are arranged in a resonator unit.

Figure 4D:
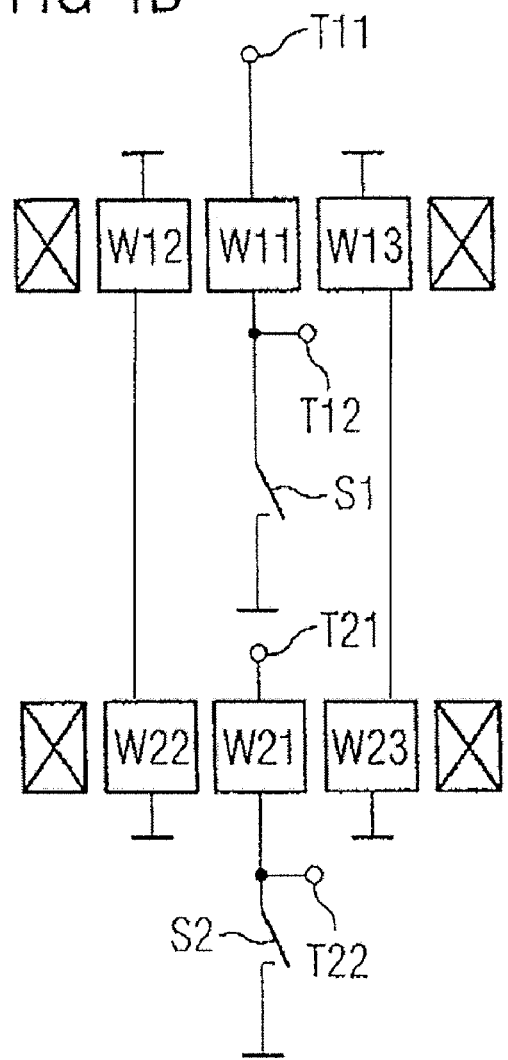
FIG. 4D, a circuit operating with SAW with two acoustic tracks that are electrically coupled via coupling transducers.

FIG. 4D shows an additional filter operating with surface acoustic waves. The filter has a first acoustic track with three transducers W11-W13, and a second acoustic track with transducers W21-W23. Transducer W11 is the input transducer of the filter. Transducer W21 is the output transducer of the filter. Transducers W12, W13, W22 and W23 are coupling transducers for input and output coupling of the electrical signal from the first acoustic track into the second one.

Input transducer W11 is arranged between transducers W12 and W13. Output transducer W21 is arranged between transducers W22 and W23. Input transducer W11 is arranged between terminals T11, T12 of first port T1. Output transducer W21 is arranged between terminals T21 and T22 of second port T2. Input transducer W11 is not electrically connected to output transducer W21.

Figure 4E:
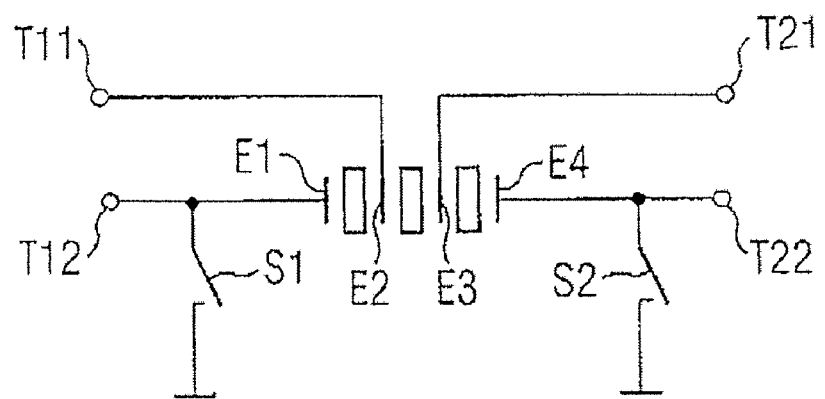
FIG. 4E, an additional circuit with resonator unit according to FIG. 3C.

FIG. 4E shows a filter with a resonator unit that is constructed as a resonator stack RS according to FIG. 3C. In this variant, lower electrode E1 of first resonator R1 is connected to second terminal T12 of the first electrical port. Electrode E2 of first resonator R1 facing coupling layer KS is connected to first terminal T11 of first electrical port T1. Electrode E3 of second resonator R2 facing the coupling layer is connected to first terminal T21 of second electrical port T2. Upper electrode E4 of second resonator R2 is connected to second terminal T22 of second electrical port T2.

Figure 5A:
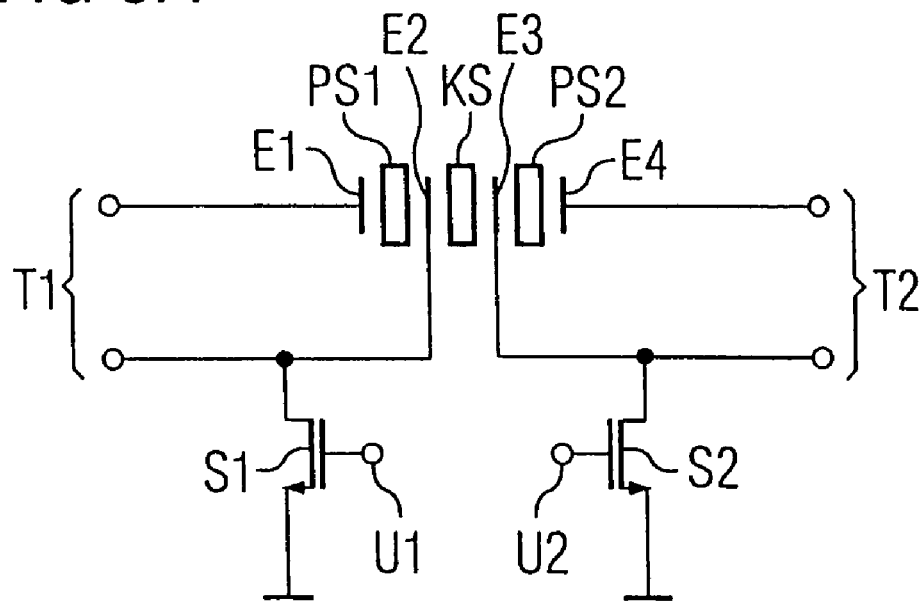
FIG. 5A, the circuit of FIG. 4A with a field-effect transistor as switching element.

In FIG. 5A, the circuit according to FIG. 4A is shown with a transistor (a field-effect transistor here) as switching element S1, S2. The transistor can also be a bipolar transistor in another variant. If needed, a first control voltage U1 is applied to the gate. Second control voltage U2 is applied to the gate of the second field-effect transistor. When first and/or second control voltage U1, U2 is applied, the corresponding switching element S1, S2 becomes conductive, grounding corresponding terminal T12, T22 of first or second port T1, T2, respectively.

Figure 5B:
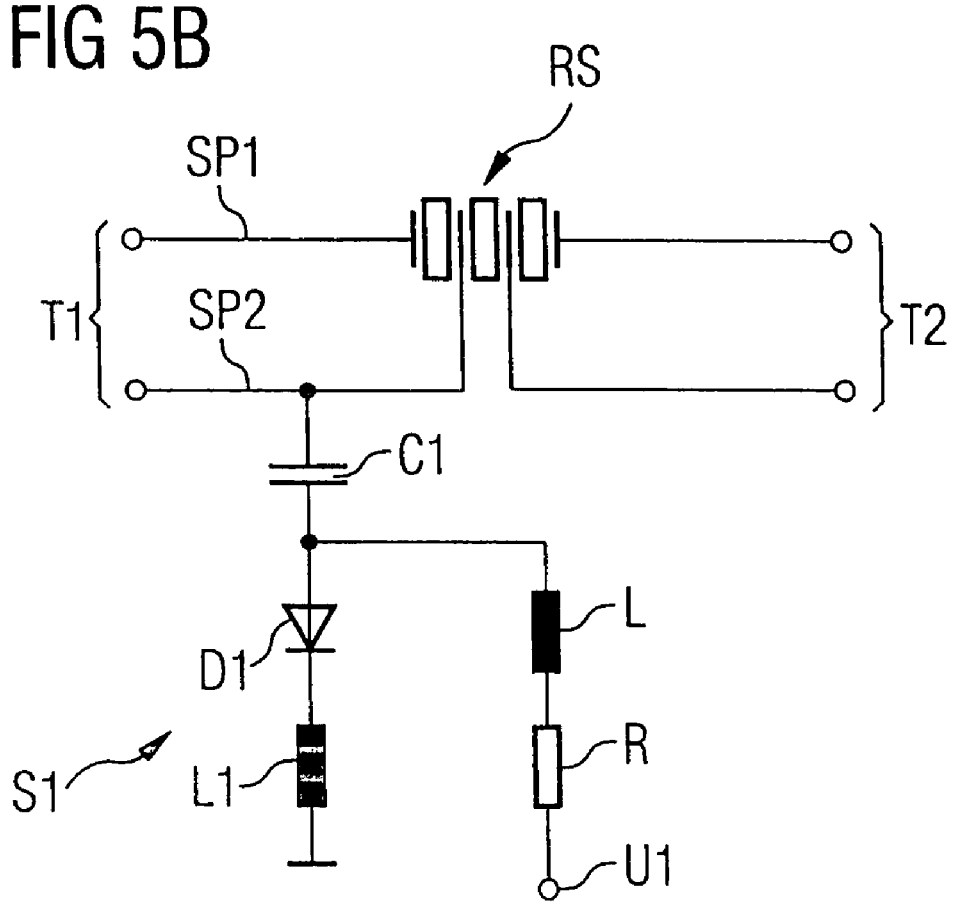
FIG. 5B, the circuit of FIG. 4A with a diode switch.

In FIG. 5B, the circuit according to FIG. 4A is shown with a diode D1 as switching element S1. Diode D1 is a PIN diode, for example.

In this example, second port T2 is always operated symmetrically.

A dc path is arranged between the electrical terminal to which control voltage U1 is applied and ground. The following elements are connected in series in the dc path: resistor R, inductor L, diode D1 and inductor L1. The dc path is separated from signal path SP2 (HF path) by means of separating capacitor C1.

When control voltage U1 is applied, diode D1 becomes conductive. The HF signal to be transmitted in signal path SP2 is conducted to ground via capacitor C1, conductive diode D1 and inductor L1. Second terminal T12 of first port T1 is also grounded, and second signal path SP2 is thereby short-circuited. In this case, first port T1 is operated asymmetrically. In case of a conductive diode D1, the resonator stack RS is thus wired as a balun.

It is also possible to connect a shunt branch with an additional PIN diode to second signal terminal T22 of second electrical port T2.

The invention is not limited to the presented embodiments, specific materials or number of illustrated elements. In all embodiments of the invention it is possible to omit first or second switching element S1, S2.

The invention claimed is:

1. An electrical circuit comprising:
   an electric four-terminal network that includes a first electrical port with a first terminal and a second terminal and a second electrical port with a first terminal and a second terminal;
   a first shunt branch between the second terminal of the first electrical port and ground; and
   a first switching element in the first shunt branch;
   wherein the electric four-terminal network comprises resonators configured to operate with bulk acoustic waves.

2. The electrical circuit of claim 1, further comprising a second shunt branch between the second terminal of the second electrical port and ground; and
   a second switching element in the second shunt branch.

3. The electrical circuit of claim 1, further comprising a resonator unit comprising a first resonator and a second resonator acoustically coupled and electrically isolated from each other.

4. The electrical circuit of claim 3, wherein the first resonator is in a first signal path and the second resonator is in a second signal path, the first signal path being separate from the second signal path.

5. The electrical circuit of claim 3, wherein:
   the first resonator between the first and second terminals of the first port; and
   the second resonator is between the first and second terminals of the second port.

6. The electrical circuit of claim 3, further comprising a partially acoustically transmissive coupling layer between the first and second resonators;
   wherein the first and second resonators are acoustically coupled to one another via the partially acoustically transmissive coupling layer.

7. The electrical circuit of claim 3, further comprising a lateral acoustic coupling layer, wherein:
   the first and second resonators are side-by-side; and
   the first and second resonators are acoustically coupled via the lateral acoustic coupling layer.

8. An electrical circuit comprising:
   an electric four-terminal network that includes a first electrical port with a first terminal and a second terminal and a second electrical port with a first terminal and a second terminal;
   a first shunt branch between the second terminal of the first electrical port and ground;
   a second shunt branch between the second terminal of the second electrical port and ground;
   a first switching element in the first shunt branch; and
   a second switching element in the second shunt branch;
   wherein the electric four-terminal network comprises first and second transducers configured to operate with surface acoustic waves.

9. The electrical circuit of claim 8, wherein:
   the first transducer is acoustically coupled to the second transducer; and
   the first transducer is electrically isolated from the second transducer.

10. The electrical circuit of claim 9, wherein:
    the first transducer is in a first signal path; and
    the second transducer is in a second signal path, the second signal path being separate from the first signal path.

11. The electrical circuit of claim 10, wherein:
    the first transducer is between the first and second terminals of the first port; and
    the second transducer is between the first and second terminals of the second port.

12. The electrical circuit of claim 9, wherein the first and second transducers are arranged in an acoustic track side by side.

* * * * *